United States Patent
Straaijer

(10) Patent No.: US 10,613,446 B2
(45) Date of Patent: Apr. 7, 2020

(54) METHOD FOR ESTIMATING OVERLAY

(71) Applicant: ASML Netherlands B.V., Veldhoven (NL)

(72) Inventor: Alexander Straaijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/121,735

(22) Filed: Sep. 5, 2018

(65) Prior Publication Data

US 2019/0079414 A1 Mar. 14, 2019

(30) Foreign Application Priority Data

Sep. 8, 2017 (EP) .................................. 17190064

(51) Int. Cl.
*G03F 7/20* (2006.01)
*G06F 17/18* (2006.01)

(52) U.S. Cl.
CPC ...... *G03F 7/70633* (2013.01); *G03F 7/70508* (2013.01); *G06F 17/18* (2013.01)

(58) Field of Classification Search
CPC ... G03F 7/70508; G03F 7/70633; G06F 17/18
See application file for complete search history.

(56) References Cited

U.S. PATENT DOCUMENTS

| 8,339,595 B2 | 12/2012 | Den Boef |
| 10,324,379 B2 * | 6/2019 | Affentauschegg ...... G03F 7/706 |

FOREIGN PATENT DOCUMENTS

| TW | 201709277 A | 3/2017 |
| WO | WO 2015/018625 A1 | 2/2015 |
| WO | WO 2015/078669 A1 | 6/2015 |
| WO | WO 2017/032736 A1 | 3/2017 |

OTHER PUBLICATIONS

International Search Report and Written Opinion of the International Searching Authority directed to related International Patent Application No. PCT/EP2018/072453, dated Oct. 23, 2018; 13 pages.
Office Action and Search Report directed to related Taiwanese Patent Application No. 107131254, dated Sep. 26, 2019, with attached English-language translation; 7 pages.

* cited by examiner

*Primary Examiner* — Michelle M Iacoletti
(74) *Attorney, Agent, or Firm* — Sterne, Kessler, Goldstein & Fox P.L.L.C.

(57) ABSTRACT

The present invention provides a method for determining overlay. The method comprises obtaining an initial overlay estimate relating to a first set of targets and data about a second set of targets, wherein the data for a target comprises an intensity measurement of the target for each of a group of different wavelengths. The method further comprises using the initial overlay estimate to filter data relating to the second set of targets and using the filtered data to estimate overlay on the substrate.

14 Claims, 8 Drawing Sheets

METHOD FOR ESTIMATING OVERLAY

FIELD OF THE INVENTION

The present invention relates to methods, systems and programs for estimating overlay.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined.

Determination of the property of interest may be performed by various techniques: e.g., reconstruction of the target structure by iterative approaches such as rigorous coupled wave analysis or finite element methods; library searches, and principal component analysis.

The targets used by some scatterometers are relatively large gratings, e.g., 40 µm by 40 µm, and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Diffraction-based overlay using dark-field detection of the diffraction orders enables overlay measurements on smaller targets. These targets can be smaller than the illumination spot and may be surrounded by product structures on a substrate. Multiple targets can be measured in one image.

In the known metrology technique, overlay measurement results are obtained by measuring the target twice under certain conditions, while either rotating the target or changing the illumination mode or imaging mode to obtain separately the −1st and the +1st diffraction order intensities. Comparing these intensities for a given grating provides a measurement of intensity asymmetry in the grating, and intensity asymmetry in an overlay grating can be used as an indicator of overlay error.

Although the known dark-field image-based overlay measurements are fast and computationally very simple (once calibrated), they rely on an assumption that overlay is the only cause of intensity asymmetry in the target structure. Any other asymmetry in the stack, such as asymmetry of features within one or both of the overlaid gratings, also causes an intensity asymmetry in the 1st orders. This feature asymmetry, which is not related to the overlay, clearly perturbs the overlay measurement, giving an inaccurate overlay result. Feature asymmetry in the bottom grating of the overlay grating is a common form of feature asymmetry. It may originate, for example, in the geometrical shape of the grating, or in the substrate processing steps such as chemical-mechanical polishing (CMP), performed after the bottom grating was originally formed. The feature asymmetry may thus include process asymmetry, where imperfections are introduced in the steps of processing the grating, or more generally, the substrate.

Methods have been found for taking the feature asymmetry into account when determining the overlay from the intensity asymmetry. However, this method still includes inaccuracies when other causes of intensity asymmetry are present such as feature asymmetry. Thus, there is room for a method to reduce inaccuracy in an overlay estimation based on this method.

SUMMARY

It is desirable to make overlay measurements more robust to account for feature asymmetry contributions to intensity asymmetry.

In an aspect of the present invention, a method is provided for estimating overlay on a substrate, the method comprising obtaining an initial overlay estimate relating to a first set of targets; obtaining data about a second set of targets, wherein the data for a target comprises an intensity measurement of the target for each of a group of different wavelengths; using the initial overlay estimate to select a sub group of wavelengths for at least one of the targets in the second set of targets; and using data relating to the sub group of wavelengths for the at least one of the targets in the second set of targets to estimate overlay on the substrate.

Another aspect of the present invention provides a system comprising a processor configured to estimate overlay on a substrate, the processor being configured to: obtain an initial overlay estimate relating to a first set of targets; obtain data about a second set of targets, wherein the data for a target comprises an intensity measurement of the target for each of a group of different wavelengths; use the initial overlay estimate to select a sub group of wavelengths for at least one of the targets in the second set of targets; and use data relating to the sub group of wavelengths for the at least one of the targets in the second set of targets to estimate overlay on the substrate.

Yet another aspect of the present invention further provides a program for estimating overlay on a substrate, the program comprising instructions for carrying out the steps of: obtaining an initial overlay estimate relating to a first set of targets; obtaining data about a second set of targets, wherein the data for a target comprises an intensity measurement of the target for each of a group of different wavelengths using the initial overlay estimate to select a sub group of wavelengths for at least one of the targets in the second set of targets; and using data relating to the sub group of wavelengths for the at least one of the targets in the second set of targets to estimate overlay on the substrate Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

The features and advantages of the present invention will become more apparent from the detailed description set forth below when taken in conjunction with the drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals, and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing embodiments of the invention in detail, it is instructive to present an example environment in which embodiments of the present invention may be implemented.

Figure 1:
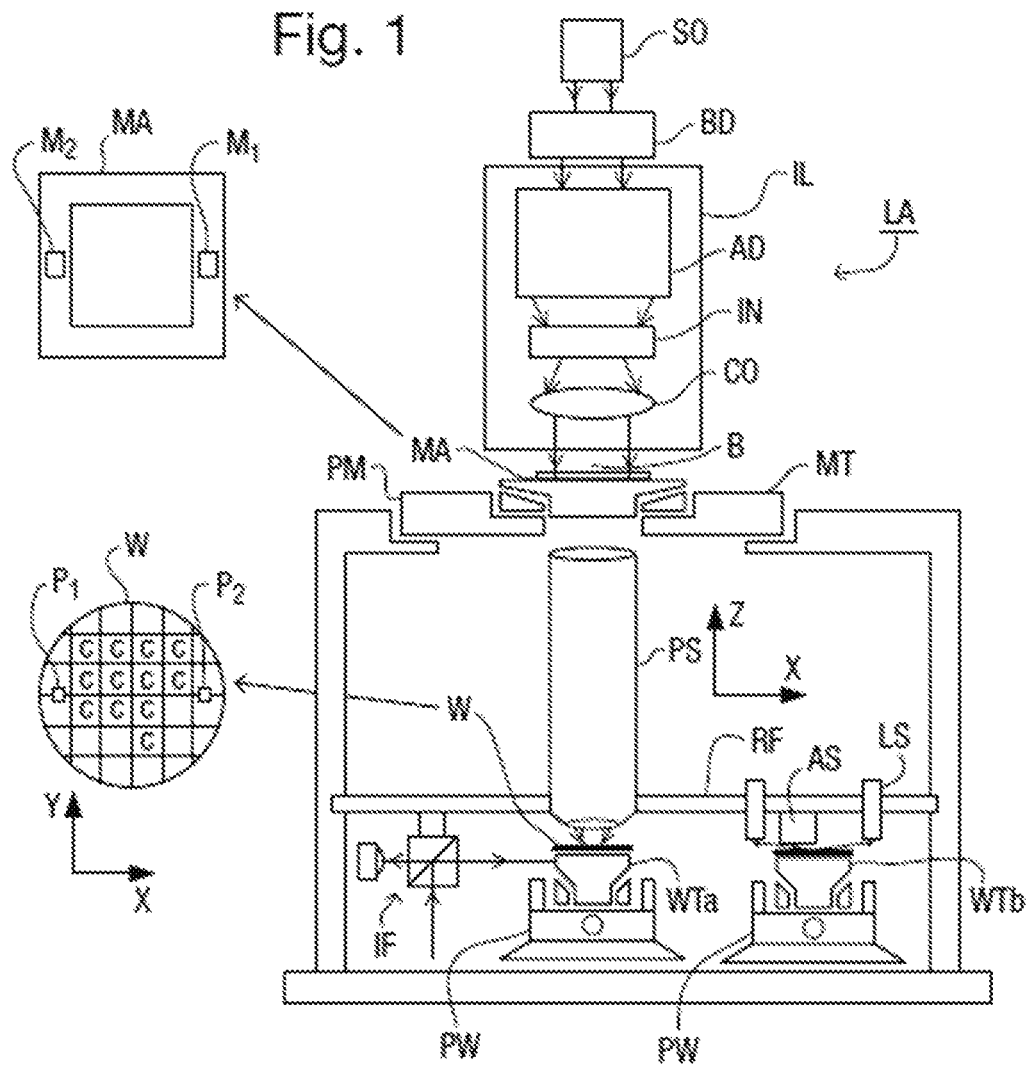
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam.

Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept substantially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept substantially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
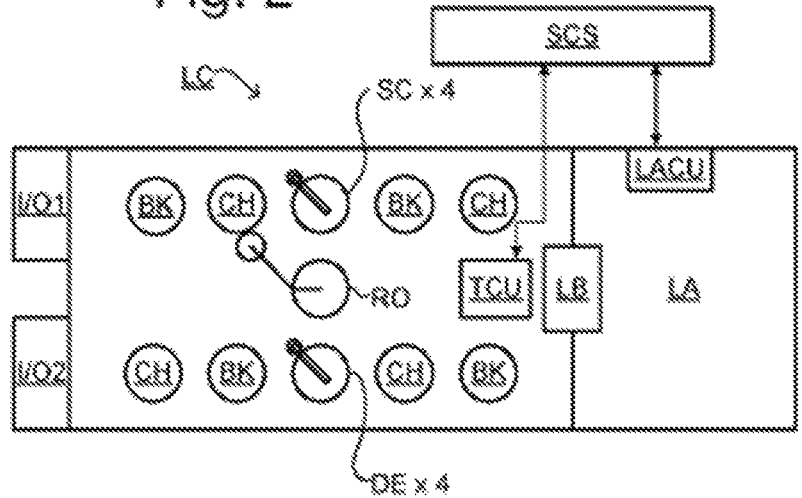
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. These include spin coaters SC to deposit resist layers, developers DE to develop exposed resist, chill plates CH and bake plates BK. A substrate handler, or robot, RO picks up substrates from input/output ports 1/O1, 1/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Detecting first order diffracted light from a target, such as a stacked grating, with overlay error is known, for examples as described in U.S. Pat. No. 8,339,595B2 which is hereby incorporated by reference in its entirety. As described in WO 2015018625, which is hereby incorporated by reference in its entirety, a target may be irradiated to take a measurement relating to the overlay at the target. As is described in further detail in WO 2015018625, diffracted radiation can be detected and different orders of diffraction can be determined, such as the first order diffraction. Asymmetry in the intensity of radiation in a specific diffracted order can be used to determine the overlay at the target. Any appropriate sort of measurement apparatus may be used to measure the intensity symmetry of a target. For example, as described in WO 2015018625 a micro diffraction based overlay (uDBO) metrology apparatus may be used which can be a stand-alone device or incorporated in either the lithographic apparatus LA, e.g., at the measurement station, or the lithographic cell LC. The intensity asymmetry can be measured in different ways at different polarizations and wavelengths.

As identified in WO 2015018635, the target itself is very unlikely to be without imperfection. Any imperfections in the grating also contribute to the intensity asymmetry. In other words, any slight defect in the target, e.g. caused by the chip processing during fabrication, will affect the intensity asymmetry which is measured. Therefore, the values relating to the measured intensity asymmetry for estimating the overlay also include variations in the measured intensity asymmetry due to any imperfections of the target itself. Thus, the overlay estimate is affected by a defect in the target, as well as the overlay error actually measured at the target. The defect or imperfection is a physical aspect of the target itself and may be generally referred to as a feature asymmetry. For example, the feature asymmetry may include side wall angle asymmetry and/or a floortilt asymmetry.

The above described method, which is based on measuring the intensity asymmetry of target, allows for very accurate measurement of overlay. However, the intensity asymmetry measurement which can be used to determine the overlay, includes the intentional overlay bias of the target, the feature asymmetry and the actual overlay error. Thus, it is beneficial to work out the feature asymmetry accurately such that the actual overlay error can be determined more accurately.

The target may comprise multiple gratings but usually two. The gratings may comprise of at least one composite grating formed by overlying gratings that are patterned in different layers of the substrate W. The overlying gratings may have differently biased overlay offsets in order to facilitate measurement of overlay between the layers in which the different parts of the composite gratings are formed. The overlying gratings may also differ in their orientation so as to diffract incoming radiation in X and Y directions. In an example, the target may comprise two X-direction gratings, one with a bias of the +d and the other with a bias of −d. The grating having a bias of d means that grating has overlying components arranged so that if they were both printed exactly at their nominal locations one of the components would be offset relative to the other by a distance d. The gratings with a bias of +d and −d would have components arranged so that if perfectly printed the offsets would be in the opposite direction to each other. The target may comprise two Y-direction gratings with offsets +d and −d respectively. Thus, the target may be described as comprising at least a first target structure, e.g. a grating, comprising an overlaid periodic structure having a first deliberate overlay bias, e.g. +d, and a second target, e.g. a grating, structure comprising an overlaid periodic structure having a second deliberate overlay bias, e.g. −d. The target may be formed and measured as described in WO 2015018625. For example, the bias (d) of the gratings, which represents the offset of the target, may be 20 nm, which may be small compared to the grating width.

As described, at least one grating of the target may comprise a plus-bias offset (e.g. +d) and a minus-bias offset (e.g. −d). In this way, the intensity measurements can be taken for the plus-bias and the minus-bias parts of the target. The measured intensity in the first diffraction order (or another chosen diffraction order) is then used to determine asymmetry in the measured intensity. From this, the A+ value is determined which is the measured intensity asymmetry in first orders using a plus-bias offset in the top resist grating and the A− value is determined which is the measured intensity asymmetry in first orders using a minus-bias offset. The intensity asymmetry for the plus-biased measurement is proportional to the plus-biased overlay, with a constant k which is referred to as a sensitivity constant. The intensity asymmetry for the minus-biased measurement is proportional to the minus-biased overlay, with the constant k. The effect of feature asymmetry in the target can be accounted for by analyzing the results by plotting the A+ values against the A− values in a plot as described below where every dot represents a single wavelength The target can be irradiated at various different wavelengths and possibly different polarizations. An A+ and an A− graph can be plotted based on the measured asymmetries of a specific target at each wavelength. The regular A+A− method described in WO 2015018625 generates similar to the graphs depicted in FIGS. 3A and 3B. When applying the regular A+A− method for multiple wavelengths, the results of two different polarizations can be averaged. However, a large amount of accuracy improvement can be achieved by correlating polarization differences to a separate quantity obtained from the data that contains only process asymmetry information. Thus, the values for (in this example two) different polarizations can be used and analyzed separately.

Figure 3A:
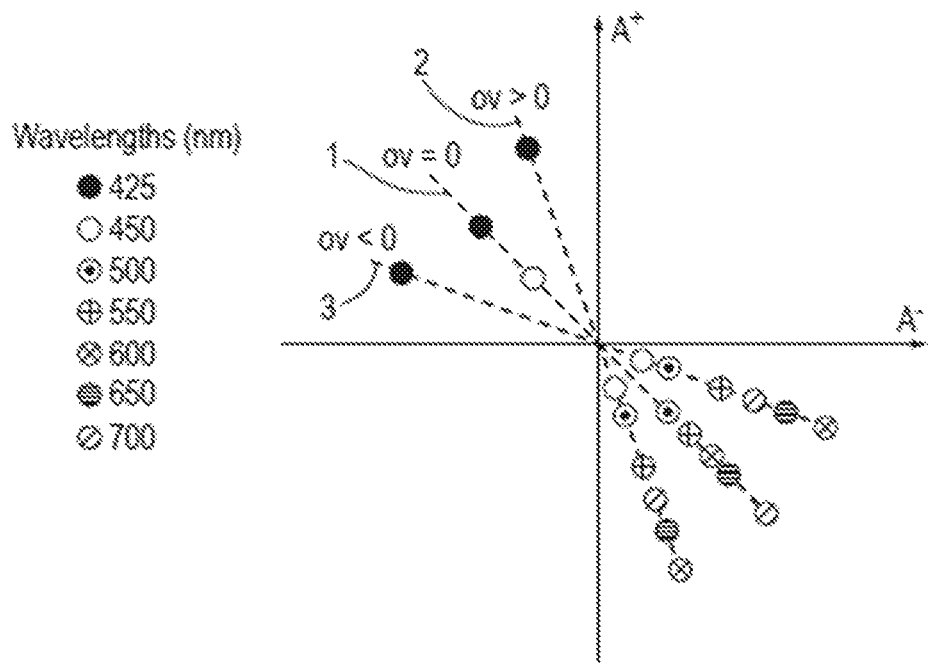
FIG. 3A depicts a plot of A+ against A− for an overlay grating that has no feature asymmetry.

FIG. 3A depicts the ideal case of a plot of A+ against A− for a target in which no feature asymmetries are present. As can be seen from FIG. 3A, the target is measured at various different wavelengths. The different wavelengths used are for information only and are not intended to be limiting. As shown, all the data points for every wavelength (and polarization) are lying on the same line. When there is no feature asymmetry, the straight line passes through the plot origin. There is a relationship between the gradient of the line and the overlay of the target. As the overlay is proportional to the intensity asymmetry, the overlay can be determined from the gradient of the line. Overlay can be determined by using the following approximated equation:

$$\text{overlay} = d * \frac{A^+ + A^-}{A^+ - A^-}$$

Where d is the known bias of the target being measured.

Three different sets of measurements are shown in FIG. 3A which relate to when there is no overlay, when the overlay is positive, (and likely, 0<OV<20 nm) and when the overlay is negative (and likely, −20<OV<0 nm). The line labelled (1) is when the gradient of the slope is −1. When the gradient is −1, the overlay is 0 nm. When the gradient is greater than −1, such as shown by line (2), the overlay is greater than zero. When the gradient of the line is smaller than −1, such as shown by line (3), the overlay is less than zero.

Figure 3B:
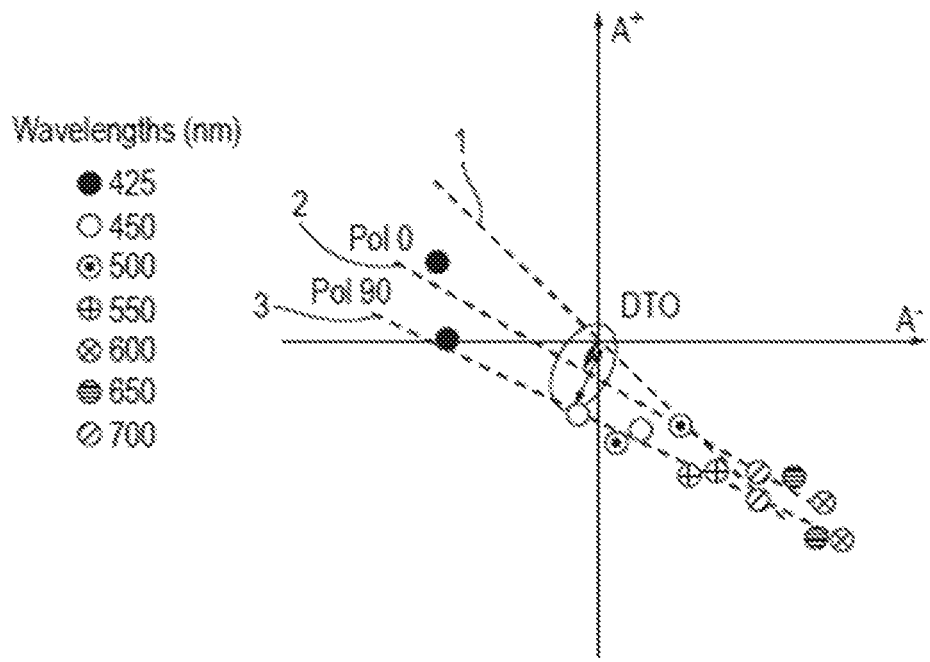
FIG. 3B depicts a plot of A+ against A− for an overlay grating that has feature asymmetry.

When there is feature asymmetry, the data for a single target at different wavelengths can still be plotted in the graph, as depicted in FIG. 3B. Line (1) in FIG. 3B shows zero overlay and no feature asymmetry for reference. However, the remaining data points at different wavelengths are no longer ordered in a straight line and instead have varying positions around a straight line. The result is that a line of best fit is determined. However, unlike in the ideal graph in FIG. 3A, the line of best fit does not pass through every data point for a single polarization and the line of best fit does not fit through the plot origin. The gradient of the line can still be used to determine the overlay.

In addition, the distance from the line to the plot origin can be determined as an extra metric called: DTO (distance-to-origin). The distance-to-origin (DTO) for each set of data is the shortest distance from the plot origin to the line, i.e. at 90° to the line of best fit through the points on the graph to the plot origin. The DTO is a useful indicator of the feature asymmetry of the target and is independent of the actual overlay. The feature asymmetry comprises process induced asymmetry. The DTO may otherwise be referred to as an offset value of the linear model for each wavelength.

As previously described, the target can be irradiated at different polarizations. Lines (2) and (3) in FIG. 3B show the wavelengths at the same target in different polarizations. FIG. 3B shows that the two polarizations can only be fitted to two different lines with different gradients and different DTO values. FIG. 3B shows line (2) which is the wavelengths at a first polarization, e.g. when the electric field vector of light is at 90° to the direction of the grating of the target, and line (3) which is the wavelengths at a second polarization, e.g. when the electric field vector of light is parallel to the directions of the grating of the target. The DTO values for lines (2) and (3) are indicated by the arrowed lines in the circle in FIG. 3B. It is noted that the DTO is different for the two polarizations and is solely dependent on feature asymmetry so this metric can be used later on to correlate to the different values from different polarizations.

In practice one unique overlay map of a complete substrate can be obtained using the A+A− method disclosed in WO 2015018625 based on many wavelengths and two polarizations, which can effectively cancel the effect of feature asymmetry.

Figure 4:
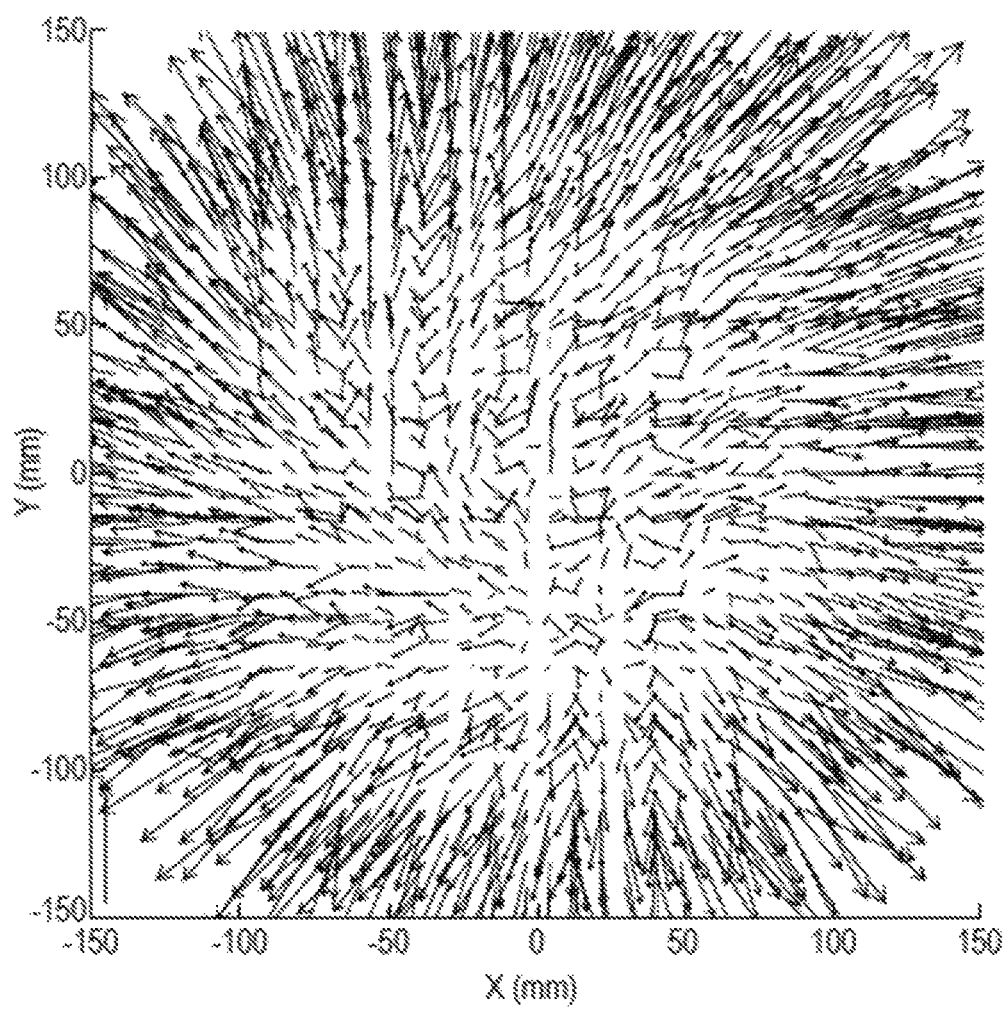
FIG. 4 depicts the average distance to origin of a fitted A+ against A− line for targets across a substrate.

Around the edge of the substrate, there tend to be larger DTO values (which is representative of the larger feature asymmetry) which are shown in FIG. 4. In FIG. 4, the value of the mentioned DTO for a target is indicated by the length of the arrowed line shown over the area of a substrate. In some cases, the values determined from the A+ against A− plot described above, when applied to the targets at the edge of the substrate with the larger DTO values, are misleading for determining the overlay. The larger feature asymmetry at the edge of the substrate may be due to an imbalance effect at the edge of a substrate. This may be due to larger differences in the layer thicknesses at the edge of the substrate, for example, as result of processing. Thus, it is beneficial to cancel out and correct for these additional errors at the edge targets.

The above known method may be improved by taking into account the larger feature asymmetry at some parts of the substrate, such as around the edge. The present invention provides a method for estimating overlay on a substrate which might be used to account for the differences of different locations of targets when determining the overlay estimate.

The method comprises obtaining an initial overlay estimate relating to a first set of targets and obtaining data about a second set of targets. The data for a target comprises an intensity measurement of the target for each of a group of different wavelengths. The method uses the initial overlay estimate to select a sub group of wavelengths for at least one of the targets in the second set of targets. As will be described, the initial overlay estimate is indicative and maybe even proportional to the overlay of the first set of targets. Other parameters may additionally be used, some at which are described below. Data relating to the sub group of wavelengths for the at least one of the targets in the second set of targets is then used to estimate overlay on the substrate.

The method may use the first set of targets to determine an overlay estimate. The method may then use the first overlay estimate to filter data relating to the second set of targets. The filtered data relating to the second set of target is then used to determine an updated overlay estimate. The advantages of this is that the second set of targets can be filtered based on the initial overlay estimate from the first set of targets. In some instances this may be particularly useful, if for example, the second set of targets have increased feature asymmetry which may lead to distortion of the overlay estimate. This means that the present invention may allow overlay data from targets at the edge of the substrate with high feature asymmetry and possibly high grating imbalance to be corrected within the $A^+A^-$ field.

In an embodiment, the intensity measurement of the target is the intensity of radiation measured at the target. The intensity measurement may be an asymmetry measurement at the target. For example, the intensity measurement can be the intensity asymmetry measurement described above. This can include the intensity asymmetry measurement based on a plus-bias offset and a minus-bias offset. As described above, the intensity asymmetry measurement is determined using the first diffraction orders. However, other diffraction orders may be used. Thus, for example, the data for a target using other orders may be the equivalent of the data points shown in FIG. 3B.

Obtaining an initial overlay estimate relating to a first set of targets may be carried out by calculating the overlay using intensity asymmetry measurements for the first set of targets as described above. Thus, the initial overlay estimate may be calculated using measurements or data relating to the first set of targets. Thus, the method may additionally comprise obtaining data about the first set of targets.

The data for a target (from the first set of targets and/or the second set of targets) may comprise an intensity measurement of the target at each of a group of different wavelengths. The data may include the intensity of radiation at a target at each of a group of different wavelengths. The data may be an indication of the diffracted radiation at that target to allow intensity asymmetry to be determined. The data may be specific intensity information relating to one of the orders of diffraction in the plus-bias and minus-bias offsets.

In the embodiment, when the data has been obtained, the method may comprise fitting a linear model to the data about the first set of targets and determining the initial overlay estimate from a gradient described by the linear model. For example, this can be done in the same way as described above in relation to FIGS. 3A and 3B. The linear model may simply be a straight line relating to the data. The linear model may be determined in various ways and may be a line of best fit, i.e. the linear model may be a way of fitting a line to the points on an A+ and A− plot. Various ways of determining a line of best fit are well know. For example, the line of best fit may be determined using a mathematical calculation called the least squares method.

Figure 5:
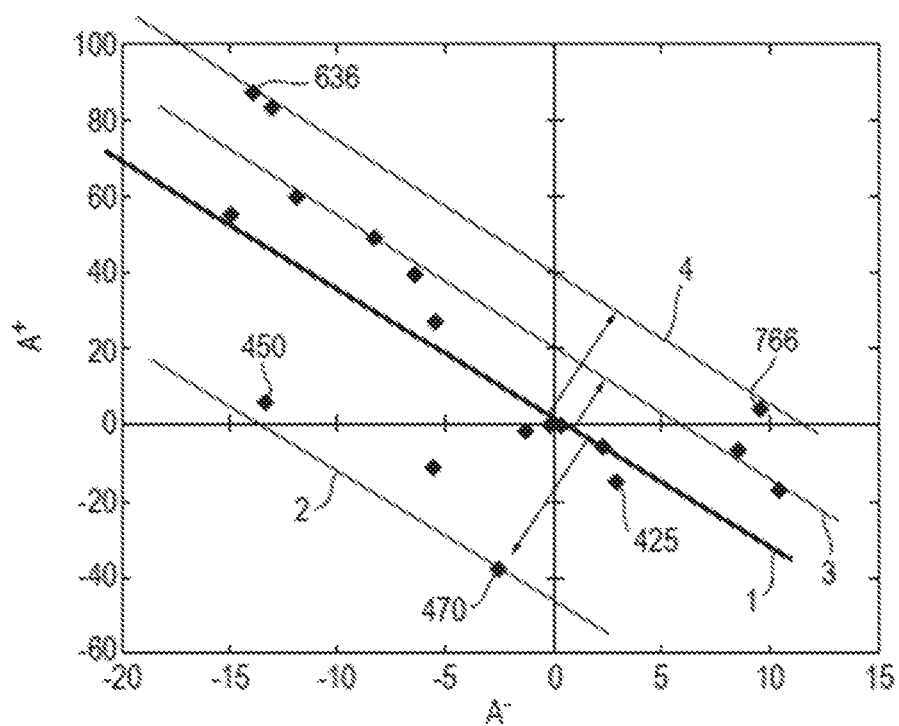
FIG. 5 depicts a plot of A+ against A− with data points measured at different wavelengths for a target at an edge of a substrate with feature asymmetry.

The data may relate to intensity asymmetry measurements for each different wavelength of radiation used to irradiate the target. The data may therefore be transformed into, or may already be, a data point for each wavelength indicating the A+ intensity and the A− intensity and thus, can be plotted in an A+ against A− graph as shown in FIG. 5. Some (but not all) of the data points are labelled to show the wavelengths for the purposes of explanation only. From this, a line of best fit may be determined for the points in the plot, i.e. a linear model may be fitted to the data about the first set of targets. A line (1) having a gradient with the line of best fit thought the data points is shown in FIG. 5. Ideally, the data points should all be along a single line. In this example, the line (1) has a gradient of −3.2 and the DTO values from this line can be determined as described in further detail below. In this particular instance, the line of best fit (1) for these data points is shown as substantially passing through the origin (i.e. with a DTO of almost zero). However, this is not necessarily the case. The initial overlay estimate can then be determined from the gradient described by the linear model, i.e. from the line of best fit.

Obtaining an initial overlay estimate relating to a first set of targets may be carried out in various other ways. The initial overlay estimate may be a predetermined value. This predetermined value may be selected by the user or may be set for carrying out the method. The predetermined value may be chosen or set as a useful starting point for determining the overlay across the substrate. The initial overlay estimate may be a previous overlay estimate. Thus, the initial overlay estimate may be based on the overlay estimate determined for a previous substrate, or for a set of targets (which might correspond to the first set of targets or the second set of targets) on a previous substrate. The initial overlay estimate may be based on several previous substrates. The overlay estimate determined for several previous substrates, or for several sets of targets (wherein each set may correspond to at least one of the first set of targets or the second set of targets), may be used to determine an average overlay value which may be used as the initial overlay estimate for the first set of targets.

Figure 6:
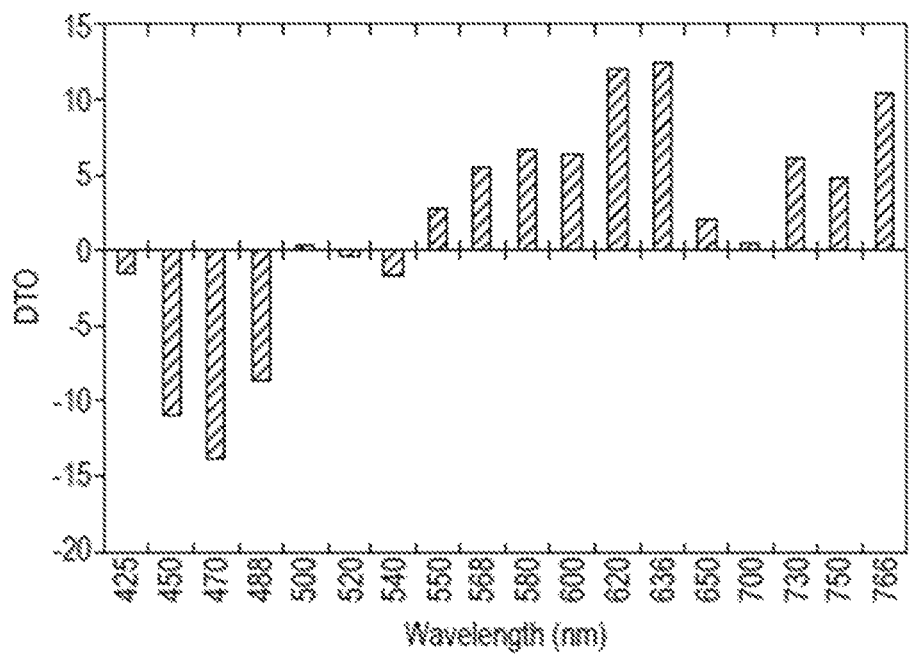
FIG. 6 depicts the distance to origin for the data points of the target measured at different wavelengths as depicted in FIG. 5.

In the embodiment, further information relating to the feature asymmetry can be obtained from this plot. In further detail, other lines parallel to the line of best fit can be determined which pass through each data point relating to specific wavelengths to determine the DTO for that data point. For example, line (2) is parallel to the line of best fit and passes through a data point for when the wavelength is 470 nm. The DTO is the shortest distance from the line through the data point and the plot origin. This value is shown by the arrow between the line through the origin and the line through data point for 450 nm. Similarly, line (3) is for another data point and line (4) is for data point at 636 nm. The new DTO values are shown for each wavelength in FIG. 6, where the DTO values are given in arbitrary units. The new DTO values for each wavelength (or the spectrum of wavelengths as shown in FIG. 6) may be used as described in further detail below.

As indicated above, the method may comprise obtaining the data relating to the first set of targets. Data relating to the first set of targets may be obtained as described above and in WO 2015018625. Additionally or alternatively, the method may comprise obtaining data relating to the second set of targets. Data relating to the second set of targets may be obtained as described above and in WO 2015/018625.

Thus, in the embodiment, the targets in the first set of targets and/or the second set of targets may be irradiated and the data obtained may be the different intensity measurements at different wavelengths. In further detail, the method may comprise obtaining data about the first set of targets and/or data about the second set of targets. Obtaining the data may comprise irradiating a target from the respective set of targets on a substrate. As described above, the target may comprise at least a first target structure comprising an overlaid periodic structure having a first deliberate overlay bias and a second target structure comprising an overlaid periodic structure having a second deliberate overlay bias. The method may further comprise detecting radiation scattered by each target structure to obtain for each target structure an intensity asymmetry measurement representing an overall intensity asymmetry which provides the data for that target.

The method may include obtaining data about one set of targets and not the other, or both. Data may be provided for one set of targets and not the other, or both. Data may be measured for one set of targets and not the other, or both.

In the embodiment, the first set of targets and the second set of targets may comprise different targets from one another. In other words, the first set of targets and the second set of targets may not have targets common to both groups. The first set of targets and the second set of targets may be located in different regions of the substrate. Thus, the first set of targets may be located in a first region of the substrate and the second set of targets may be located in a second region of the substrate. It is beneficial to provide the targets in different regions or areas, because this means that one set of targets may effectively be used to filter another set of targets to generate a more accurate overlay estimate overall.

The first region may be located substantially in the centre of the substrate and the second region may be located substantially around the edge of a the substrate. This may be particularly beneficial because the edge targets may have more feature asymmetry. This could be for a variety of reasons. For example, the processing may lead to greater thicknesses at the edge of the substrate such that the edge targets have greater feature asymmetry. Thus, the targets with greater feature asymmetry may also have some data points which do not follow the above described process such that these data points distort the overlay estimate if the overlay estimate is simply determined using all of the data points as described with respect to the first set of data points.

The first region and the second region may be separate regions which are distinct from one another. Preferably, the first region (in which the targets are used to determine the initial overlay estimate) is in the centre of the substrate. It is preferable to use only targets substantially in the center of the substrate for the first set of targets because for these targets, the DTO spectrum (as shown in FIG. 6) in the x direction can be very well correlated to the substrate position in the x direction and DTO spectrum (as shown in FIG. 6) in the y position can be well correlated to the substrate position in the y direction. This is because process asymmetries usually show a radial dependence and such correlation hugely increases the accuracy of the DTO spectrum.

Preferably, the second region (in which targets have data which is filtered as described below) is at the edge of the substrate. The area which the first region and the second region take up on the substrate may be variable. There may be a preferred area for each of the first region and the second region. Preferably, the second region is the area of the substrate surrounding the first region.

The first region may be a region within a distance of less than or equal to 130 mm from the centre of the substrate. The second region may be a region with a distance of greater than 130 mm from the centre of the substrate. The second region may not extend up to the edge of the substrate. The second region may be at a radius of approximately 130 mm to approximately 145 mm from the centre of the substrate. These are example distances for the first region and second region for a substrate which is approximately 300 mm in diameter. This distance may be changed/scaled depending on the size of the substrate. For example, for a 450 mm diameter substrate, the first region may be within a distance of approximately 195 mm from the centre of the substrate. The first and second region may be preferably determined based on the overall area of the substrate. For example, approximately the central 75% of the area of the substrate may be the first region and the second region may substantially be the surrounding area.

The second set of targets may be located on the substrate and the first set of targets are located on at least one other substrate. This means that the data relating to the first set of targets may be from another substrate, or multiple other substrates.

The method comprises using the initial overlay estimate to select a sub group of wavelengths for at least one of the targets in the second set of targets. This allows data relating to the second group of targets to be filtered based on the initial overlay estimate. This is beneficial because it means that data points which do not fit with the model are left out, thus reducing the impact of certain targets.

Selecting a sub group of wavelengths for at least one of the targets in the second set of targets comprises performing analysis on the group of wavelengths for each target in the second set of targets and determining if a linear model for each wavelength has a gradient which substantially corresponds to the initial overlay estimate. This is a further linear model which differs from the liner model described above. This will be referred to as the further linear model from hereon in.

Figure 7A:
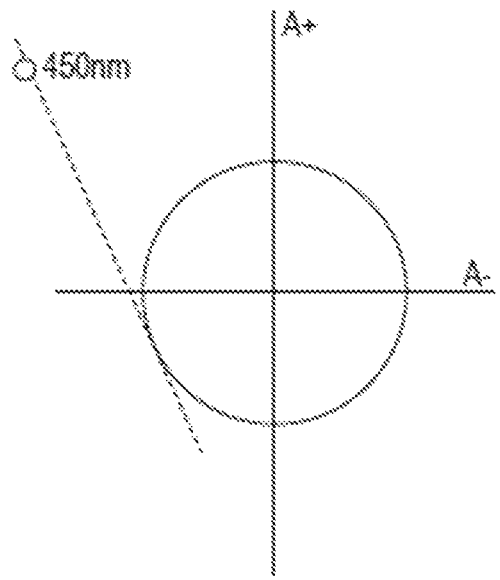
FIGS. 7A and 7B depict how the gradient of a line in an A+ against A− plot can be used to determine if a specific wavelength is obedient.

The further linear model can applied to the data points of the second set of targets to determine whether or not a data point for a wavelength of a target from the second set of targets is obedient. This is done by determining the offset value (i.e. the DTO) for a data point. A circle is drawn in the A+ against A− plot being centred on the plot origin and having a radius which is the same as the offset value. A line is then determined which passes through the data point and is tangential to the circle. This is shown for two different points in FIGS. 7A and 7B. The gradient of this line is these used to determine if the data point is obedient, as described above, i.e. whether the line substantially corresponds to the initial overlay estimate.

This process can be carried out for separate polarizations and may be separated x and y coordinates. This means that different polarizations may have different data points which are regarded to be obedient. Therefore, for one target, different data points will be used depending on which polarization is being used and in which direction (e.g. x or y).

Figure 7B:
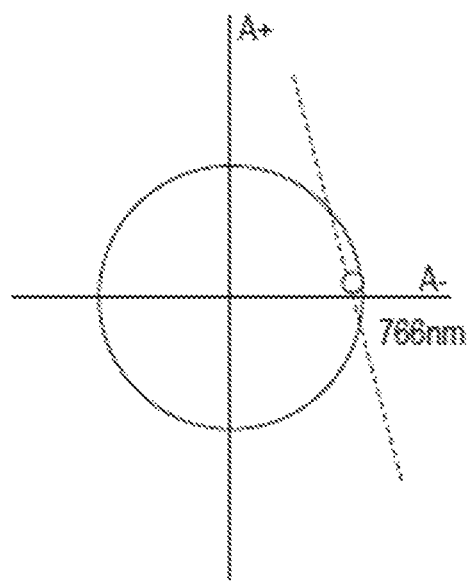
Figure 8:
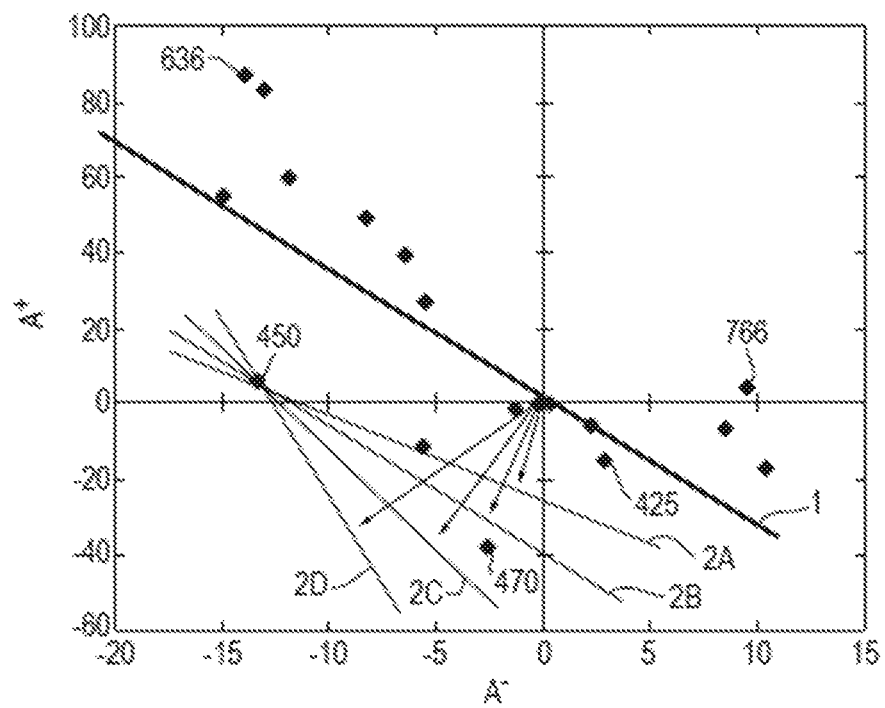
FIG. 8 depicts the A+ against A− plot shown in FIG. 5 wherein a distance to origin is determined for a specific wavelength at the target.
Figure 9:
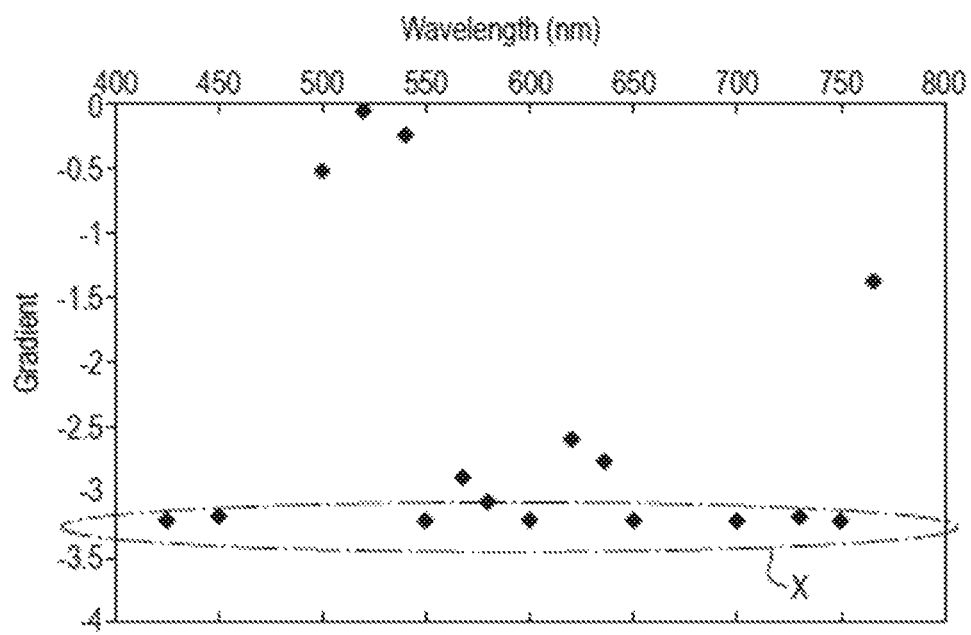
FIG. 9 depicts the distance to origin for different wavelengths to determine which wavelengths are obedient.
Figure 10A:
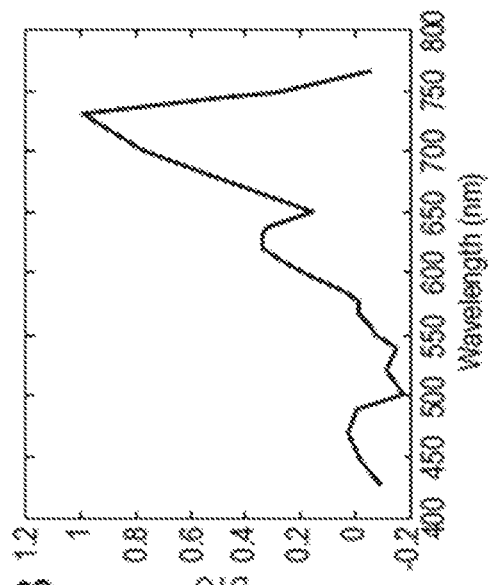
FIGS. 10A to 10D depict reference information at different wavelengths.
Figure 10B:
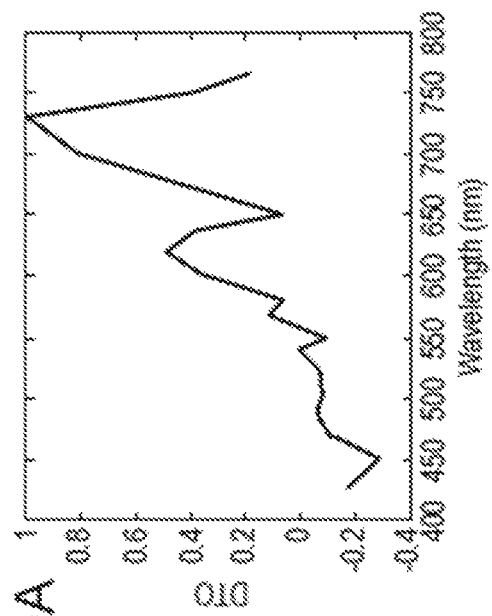
Figure 10C:
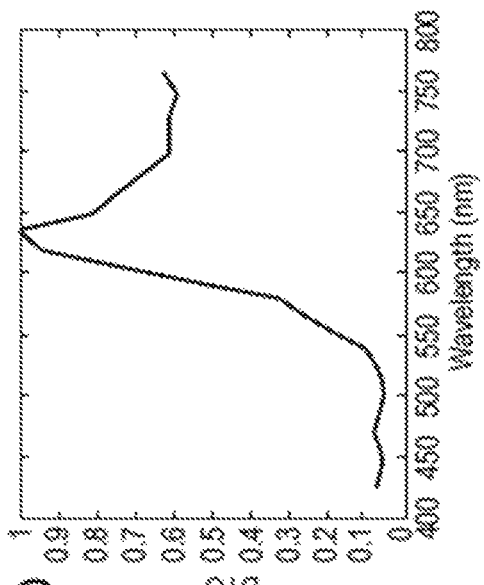
Figure 10D:
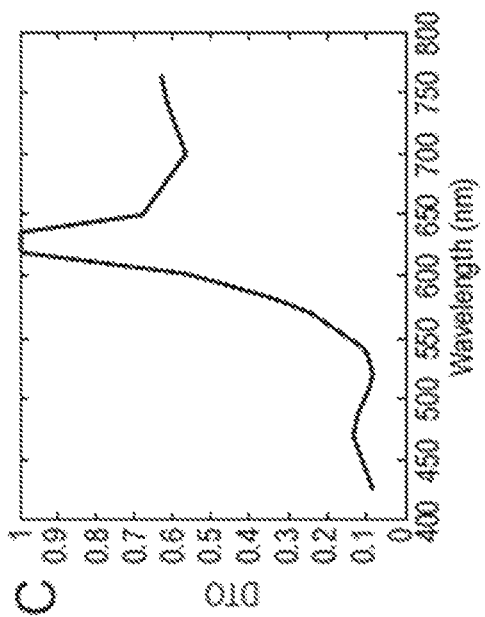

In further detail and using the values provided in the figures by way of example. For the 450 nm wavelength data point, a circle with radius of 11 is drawn on the A+ against A− plot. The offset value is the DTO for that data point which can be determined from FIG. 6. When a line is drawn through the data point which is tangential to the circle, the gradient of the line is −3.2. For the 766 nm wavelength data point, a circle with radius of 10 is drawn on the A+ against A− plot. As shown in FIG. 7B, it is not possible to draw any tangential line to the circle which passes through the data point. In this example, the gradient of the line would become indefinite FIG. 8 shows the data points from each wavelength with the line of best fit through the origin of the plot. Using the further linear method, a line will be determined for each data point in the A+ against A− plot using the circle with four randomly chosen DTO values as the radius and the gradient of this line can be determined. FIG. 9 shows an example plot of the gradients determined for each wavelength data point using the above described method. The line for the data point at 450 nm from the further linear method is evaluated to determine if is substantially corresponds to the gradient representing the initial overlay estimate. The gradients of the lines determined for the wavelengths of a target of the second set of targets using the further linear method should in principle be equal to, or substantially correspond to, −3.2 (which is the same as the gradient representing the first overlay estimate described above). However, many wavelengths drop out of this test because they are mathematically unstable and cannot be used further.

In this context, substantially corresponds may mean that the gradient of the line in the further linear model is similar to a gradient which represents the initial overlay estimate. In other words, the gradient of the line in the further linear model, corresponds to the initial overlay estimate. The gradient of the line from the further linear model for the wavelengths of a target from the second set of targets may be compared to a gradient representing the initial overlay estimate. A range of allowable gradients may be determined based on the gradient representing the initial overlay estimate. The range may be set by a predetermined value, e.g. within 0.01, 0.1, or may be any value such that at least two or three wavelength are still available at the end of this filtering procedure. Alternatively, the value of the gradient may be within at least approximately 10% of the value of the gradient which represents the initial overlay estimate, or within approximately 1% to 10%. The percentage may be based on the gradient representing the overlay, or on the estimated overlay value itself. If the range is too small, then too few wavelengths will be available and ultimately too few targets from the second set of targets will be used. However, if the range is too large then the filtering effect will be lessened. Thus, the range may be set such that the sub group of wavelengths comprises at least 2 or 3 wavelengths. In other words, the range may be set such that after filtering, there is data relating to at least 2 or 3 wavelengths which can be used.

As shown in FIG. 9, which is for example only, the wavelengths which have a gradient within 0.01 of the gradient corresponding to the initial overlay estimate may be selected as obedient. These data points are included in the circle labelled X. As shown, there are only 8 or 9 out of the 16 data points which would be determined to be obedient. Thus, the data points in the circle labelled X will be used to determine the sub-group of wavelength used to estimate overlay for this specific target. Different sub groups of wavelengths will be determined for different targets.

This allows the individual data points relating to a target to be filtered. In this way, data points, and thus chosen wavelengths, which have values which cooperate in the method are used for determining the overlay. In other words, the data points which are obedient, i.e. which are well behaved, are used. Data points which do not conform, i.e. which are not obedient, are not used for determining the overlay and are discarded.

The method further comprises using data relating to the sub group of wavelengths for the at least one of the targets in the second set of targets to estimate overlay on the substrate. This means that the filtered data set (i.e. the sub group of wavelengths for the second group of targets) is used for determining an updated overlay estimate. This may be done by comparing the filtered data set with data relating to the first data set, and or stored data as described below.

As described above, for each data point relating to a different wavelength (in either set of data), once the linear method is used to determine a line with a gradient representing the overlay, the method may further comprise determining the distance to origin (DTO). This can be carried out by finding a line parallel to the line of best fit, which passes through the data point of interest. The DTO is then the shortest distance from the plot origin in the A+ against A− graph to this line passing through the data point of interest. Thus, this provides the DTO for that wavelength. The DTO as function of wavelength (e.g. as shown in FIG. 6) may otherwise be referred to as an offset value. Thus, the offset value represents the contribution to the overlay due to a physical defect of the target, i.e. a feature asymmetry of the target. The method may comprise determining an offset value of the linear model for each of the wavelengths from the group of wavelengths for a target in the first set of targets.

The offset value for multiple targets in the first set of targets may be evaluated. Thus, the average offset value for each wavelength for the targets in the first set of targets can be determined. The average may simply be a sum of the total values for one specific wavelength divided by the number of targets providing information relating to that wavelength. The average offset value for each wavelength of the targets in the first set of targets can be stored as reference information, which may otherwise be referred to as a library. Overlay on the substrate can be estimated by comparing data relating to the sub group of wavelengths for the second set of targets with the reference information. Preferably, the reference information relates to data points from a region of targets located substantially in the centre of a substrate as described above, e.g. in a first region in the centre of a substrate. Even if offset value data relating to the first set of targets is from a different substrate (or multiple different substrates) than the second set of targets, the data may still relate to targets substantially in the centre of the other substrate(s) as described above.

The offset values relating to the second group of targets could instead be compared to individual offset values of only one of the first set of targets. In other words, the reference information may be values from a single target. However, the offset values would not be as accurate. Thus, it is preferred to use offset values as described above from a region with moderate process asymmetries, e.g. a substantially central region. FIGS. 10A to 10D depict average offset values over a range of wavelengths for the first set of targets. The values of the DTO have been normalised using the location of the target on the substrate (in the x and y directions as relevant) and normalising the values to 1 since primarily only the shape of the spectrum may be of importance. The figures depicted in FIGS. 10A to 10d show different x and y values at different polarizations. Thus, reference values for different axes (i.e. in the x and y directions) and different polarizations may be separated and used separately as shown. For example, FIGS. 10A and 10B may relate to the targets measured at 0° polarization, wherein 10A is the DTO in the x direction and 10B is the DTO in the y direction. For example, FIGS. 10C and 10D may relate to the targets measured at 90° polarization, wherein 10A is the DTO in the x direction and 10B is the DTO in the y direction.

The reference information could relate to offset values from multiple targets on a substrate, which may be the same or a different substrate as the one comprising the second set of targets. The reference information may comprise offset values of many different substrates and may use an average from the different substrates. Alternatively, the reference values may be pre-determined values used for comparison or even stored (i.e. placed in a library) for specific type of asymmetry linked to the wafer fabrication processes used.

Comparing the data relating to the sub group of wavelengths for the second set of targets with the reference information may comprise comparing the offset values for the sub group of wavelengths for the second set of targets and the reference information. This comparison may be done by carrying out a form of best fit analysis using only the sub group of wavelengths. The analysis can be based on the following equation:

$$DTO_{actual}(\text{wavelength}) = a + b \cdot DTO_{ref}(\text{wavelength})$$

where a and b are constants used to determine the best fit. In this equation, the $DTO_{actual}$ is the DTO of the subgroup of wavelengths from the second set of targets. The $DTO_{ref}$ values are based on the reference values stored for that specific wavelength and if relevant, that specific polarization and x or y direction.

Figure 11:
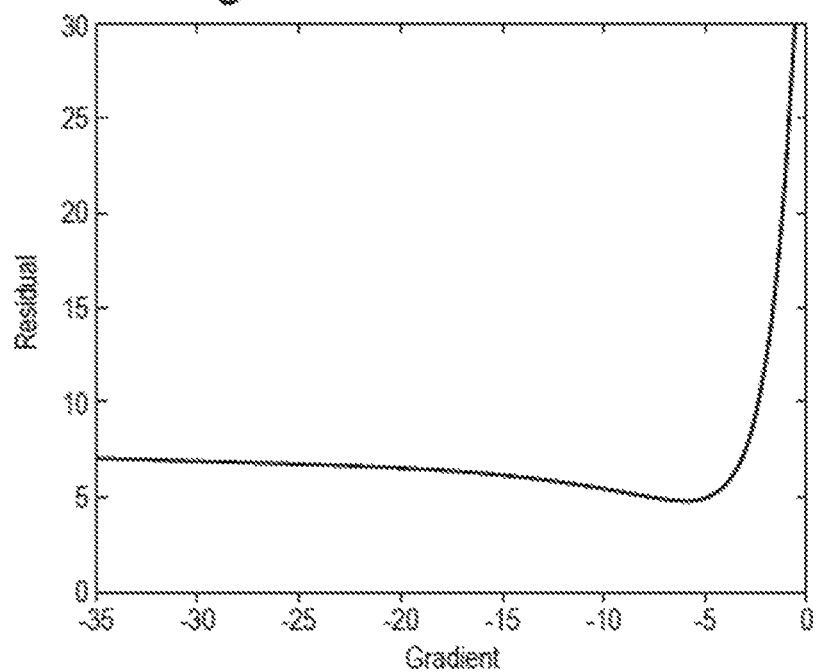
FIG. 11 depicts the residuals from a best fit determination plotted against the gradient of the slope shown in the plot of A+ against A− of FIG. 8.
Figure 12:
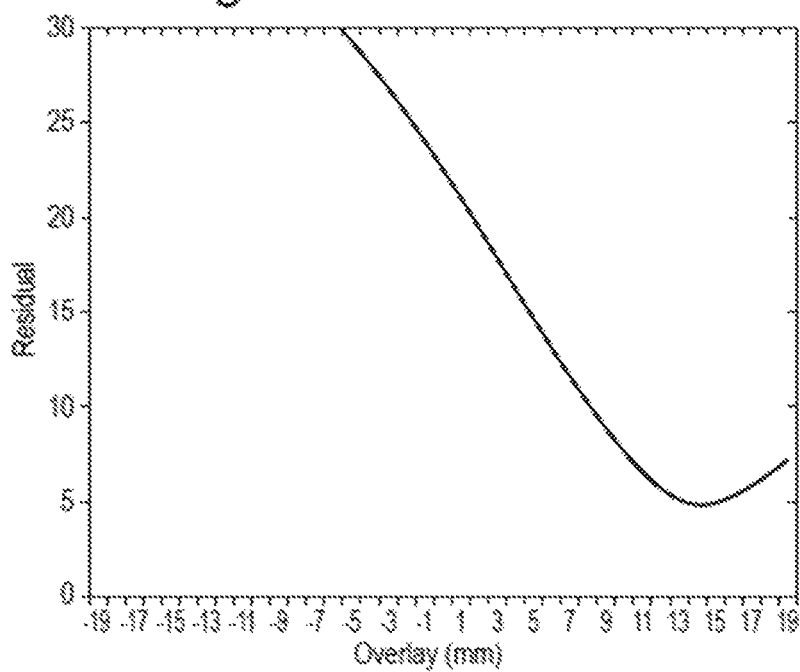
FIG. 12 shows the residuals from a best fit determination plotted against the overlay corresponding to different values of slope gradient.

It is well known that various different types of best fit analysis can be carried out on similar kinds of data. Programs are known which can carry out the relevant analysis. When determining the best fit, the analysis may also generate residuals of the fit. These may also be determined using known programs. The residuals can be plotted against varying values for the gradient or overlay. These are shown in FIGS. 11 and 12. The estimated gradient/overlay may correspond to the minimum residual calculated. The new slope gradient, the new overlay and new average DTO for this target from the second group of targets can then be stored.

The $DTO_{actual}$ values can be determined for different amounts of overlay by varying the overlay as shown in FIG. 8. The lines 2A-2D of FIG. 8 show how the DTO would change and consequently the whole DTO-spectrum as the gradient (representing the overlay) is changed. The overlay can be varied, for example, from −19 nm to +19 nm. It is not necessary to look at this specific range, but ideally the range should include the expected value of the updated overlay estimate. A broader range may be chosen, for example, to include a minimum of the residuals. The gradient of the slope may vary to any value and the minimum of the DTO residual can be determined as shown in FIGS. 11 and 12. The residuals are indicative of the confidence of the fit. This can be carried out by known numerical analysis. The gradient values can be simply converted to overlay values as described above.

From either one of these figures, the average updated overlay values can be determined from looking at multiple, or all of the targets in the second group of targets. For each target, on the data points relating to the subgroup of wavelengths is used. This overlay value can then be applied to the whole wafer. The updated overlay value generally provides a more accurate overlay estimate than when the second target data point are not filtered.

It is more accurate to deal with the different polarizations and x and y coordinates separately, but if preferred, the data can be combined to include both polarizations and/or both coordinates. Keeping the polarizations separate may mean that the final result includes slightly different overlay values for each polarization. At this stage, one or other of the updated overlay estimates can be used or the values can be averaged or preferably, the overlay values for separate (in this example two) polarizations can be correlated to the recently stored new, and possibly averaged, DTO values per polarization.

Any values above which are determined may be stored for later use in a memory. Different types of memory may be used depending on how accessible the stored information needs to be.

The present invention further comprises a system comprising a processor configured to estimate overlay on a substrate by carrying out any or all of the method steps described above. The present invention provides a system comprising a processor configured to estimate overlay on a substrate, the processor being configured to: obtain an initial overlay estimate relating to a first set of targets, obtain data about a second set of targets, wherein the data for a target comprises an intensity measurement of the target for each of a group of different wavelengths; use the initial overlay estimate to select a sub group of wavelengths for at least one of the targets in the second set of targets; and use data relating to the sub group of wavelengths for the at least one of the targets in the second set of targets to estimate overlay on the substrate. The system may comprise a memory to store the relevant data points, measurements, reference DTO spectra, initial overlay estimate, updated overlay estimate, and/or other reference information, etc.

The present invention further comprises a program for estimating overlay on a substrate, the program comprising instructions for carrying out any or all of the method steps described above. The present invention provides a program for estimating overlay on a substrate, the program comprising instructions for carrying out the steps of: obtaining an initial overlay estimate relating to a first set of targets; obtaining data about a second set of targets, wherein the data for a target comprises an intensity measurement of the target for each of a group of different wavelengths; using the initial overlay estimate to select a sub group of wavelengths for at least one of the targets in the second set of targets; and using data relating to the sub group of wavelengths for the at least one of the targets in the second set of targets to estimate overlay on the substrate.

Any of the above methods, systems or programs may be used as at least part of a method of manufacturing devices using lithographic techniques Furthermore, the techniques disclosed herein can be applied to large scatterometer targets, also referred to as standard targets, the overlay in these larger targets can be measured by angle-resolved scatterometry using a pupil image sensor instead of or in addition to measurements made by a dark-field imaging branch and sensor.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within the control unit LACU of FIG. 2. There may also be provided a data storage medium (e.g., semiconductor memory, magnetic or optical disk) having such a computer program stored therein. Where an existing metrology apparatus is already in production and/or in use, the invention can be implemented by the provision of updated computer program products for causing a processor to perform the steps described above and so calculate overlay error with reduced sensitivity to feature asymmetry. The program may optionally be arranged to control an optical system, substrate support and the like to perform the steps for measurement of intensity asymmetry on a suitable plurality of target structures.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Further aspects according to the invention are further described in below clause:

16. The program of clause 15, the program comprising instructions for carrying out the method of any one of clause/s 1 to 12.

The breadth and scope of the present invention should not be limited by any of the above-described exemplary embodiments, but should be defined only in accordance with the following claims and their equivalents.

The invention claimed is:

1. A method for estimating overlay on a substrate, the method comprising:
   obtaining an initial overlay estimate relating to a first set of targets;
   obtaining data about a second set of targets, wherein the data for a target of the second set of targets comprises an intensity measurement for each of a group of different wavelengths;
   using the initial overlay estimate to select a sub group of wavelengths of the group of different wavelengths for at least one of the targets in the second set of targets; and
   using data relating to the sub group of wavelengths for the at least one of the targets in the second set of targets to estimate overlay on the substrate.

2. The method of claim 1, further comprising obtaining data about the first set of targets and fitting a linear model to data about the first set of targets and the obtaining an initial overlay estimate comprises determining the initial overlay estimate from a gradient described by the linear model.

3. The method of claim 2, further determining an offset value of the linear model for each of the wavelengths from the group of wavelengths for a target in the first set of targets, wherein the offset value represents a contribution to the overlay due to a physical defect of the target in the first set of targets.

4. The method of claim 3, wherein an average offset value for each wavelength for the targets in the first set of targets is determined and stored as reference information, and overlay on the substrate is estimated by comparing data relating to the sub group of wavelengths for the second set of targets with the reference information.

5. The method of claim 4, wherein the comparison comprises performing a best fit analysis on the offset values for the sub group of wavelengths for the second set of targets compared to the reference information, to determine residuals of the fit, and the estimated overlay corresponds to the minimum residual calculated.

6. The method of claim 1, wherein the method is performed on the first set of targets located in a first region of the substrate and the second set of targets located in a second region of the substrate.

7. The method of claim 1, wherein the method is performed on the first region located substantially in the centre of the substrate and the second region located substantially around the edge of the substrate.

8. The method of claim 7, wherein the method is performed on the first region, which is a region within a distance of less than or equal to 130 mm from the centre of the substrate, and on the second region, which is a region with a distance of greater than approximately 130 mm from the centre of the substrate.

9. The method of claim 1, wherein the method is performed on the second set of targets located on the substrate and the first set of targets located on at least one other substrate.

10. The method of claim 1, wherein obtaining data about the first set of targets and/or data about the second set of targets comprises:
   irradiating a target from the respective sets of targets on a substrate, the irradiated target comprising at least a first target structure comprising an overlaid periodic structure having a first deliberate overlay bias and a second target structure comprising an overlaid periodic structure having a second deliberate overlay bias; and
   detecting radiation scattered by each target structure to obtain for each target structure an asymmetry measurement representing an overall intensity asymmetry which provides the data for that target.

11. The method of claim 1, wherein selecting a sub group of wavelengths for at least one of the targets in the second set of targets comprises performing analysis on the group of wavelengths for each target in the second set of targets and determining if a further linear model for each wavelength has a gradient that substantially corresponds to the initial overlay estimate.

12. The method of claim 11, wherein the value of the gradient is within at least approximately 1% to 10% of the initial overlay estimate such that the sub group of wavelengths comprises at least 2 or 3 wavelengths.

13. A system comprising a processor configured to estimate overlay on a substrate, the processor being configured to:
   obtain an initial overlay estimate relating to a first set of targets;
   obtain data about a second set of targets, wherein the data for a target in the second set of targets comprises an intensity measurement of the target for each of a group of different wavelengths;
   use the initial overlay estimate to select a sub group of wavelengths of the group of different wavelengths for at least one of the targets in the second set of targets; and
   use data relating to the sub group of wavelengths for the at least one of the targets in the second set of targets to estimate overlay on the substrate.

14. A non-transitory computer program product for estimating overlay on a substrate, comprising instructions for carrying out the steps of:
   obtaining an initial overlay estimate relating to a first set of targets;
   obtaining data about a second set of targets, wherein the data for a target in the second set of targets comprises an intensity measurement of the target for each of a group of different wavelengths;
   using the initial overlay estimate to select a sub group of wavelengths of the group of different wavelengths for at least one of the targets in the second set of targets; and
   using data relating to the sub group of wavelengths for the at least one of the targets in the second set of targets to estimate overlay on the substrate.

* * * * *